(12) United States Patent
Yu et al.

(10) Patent No.: US 6,271,563 B1
(45) Date of Patent: *Aug. 7, 2001

(54) MOS TRANSISTOR WITH HIGH-K SPACER DESIGNED FOR ULTRA-LARGE-SCALE INTEGRATION

(75) Inventors: Bin Yu, Fremont; Ming-Ren Lin, Cupertino, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,815

(22) Filed: Jul. 27, 1998

(51) Int. Cl.[7] .......................... H01L 29/76; H01L 29/94; H01L 31/062
(52) U.S. Cl. ........................ 257/344; 257/408; 257/410
(58) Field of Search .................... 257/410, 411, 257/402, 344, 408

(56) References Cited

U.S. PATENT DOCUMENTS

| 4,062,699 | 12/1977 | Armstrong | 438/276 |
|---|---|---|---|
| 4,530,150 | 7/1985 | Shirato | 438/227 |
| 4,994,869 | * 2/1991 | Matloubian et al. | 257/344 |
| 5,091,324 | 2/1992 | Hsu et al. | 438/200 |
| 5,215,937 | 6/1993 | Erb et al. | 438/289 |
| 5,243,212 | * 9/1993 | Williams | 257/344 |
| 5,347,153 | 9/1994 | Bakeman, Jr. | 257/345 |
| 5,554,876 | * 9/1996 | Kusunoki et al. | 257/344 |
| 5,661,059 | 8/1997 | Liu et al. | 438/276 |
| 5,698,883 | * 12/1997 | Mizuno | 257/344 |

OTHER PUBLICATIONS

Hara, Yoshiko, "Japan Sees Shortcut to 0.05–Micron Chip," *EE Times—Headline News*(1998), pp. 1–3.

Wolf, Stanley, "Silicon Processing for the VLSI ERA." vol. 3: *The Submicron MOSFET*, pp. 136–138.

* cited by examiner

*Primary Examiner*—Steven Loke
(74) *Attorney, Agent, or Firm*—Eschweiler & Associates, LLC

(57) ABSTRACT

A MOS transistor having a source and drain extension that are less than 40 nanometers in thickness to minimize the short channel effect. A gate includes a high-K dielectric spacer layer to create depletion regions in the substrate which form the drain and source extensions.

13 Claims, 2 Drawing Sheets

INVERSION LAYERS ACT AS "PSEUDO" EXTENSION OF SOURCE AND DRAIN

INVERSION LAYERS ACT AS "PSEUDO" EXTENSION OF SOURCE AND DRAIN

MOS TRANSISTOR WITH HIGH-K SPACER DESIGNED FOR ULTRA-LARGE-SCALE INTEGRATION

BACKGROUND OF THE INVENTION

1. Field of the Invention

This invention relates to a MOS transistor with a high-K spacer designed for ultra-large-scale integration, and, more particularly, to a MOS transistor having shallow source/drain extension regions to minimize short-channel effects.

2. Description of Related Art

Attempts continue to shrink the dimensions of MOS transistors. Devices having sub-micrometer dimensions permit closer placement of devices thereby increasing the density of devices on a chip and their operating speed.

As the size of MOS transistors decreases, the distance between the source and drain wells of a transistor, i.e., channel length, also decreases thereby subjecting the transistor to what is called "the short-channel effect." As the effective channel length of a transistor shrinks below about 0.10 micron, electrical effects begin to reduce the threshold voltage and increase leakage current of the device which eventually make the transducer useless.

One approach to minimizing the short-channel effect has been to make the depth of the channel between the source and drain shallow relative to its length. Generally this is done in one of two ways. One way is to raise the source and drain above the surface of the silicon substrate. Another way is to create extensions of the source and drain wells that are shallower in depth than the source and drain wells. These shallow extensions allow the formation of a channel between the extensions that is shallower than would otherwise occur. One way to create shallower drain and source extensions is by ion implantation.

Creating shallow drain and source extension regions by ion implantation is very difficult. At conventional implantation energy, those ions are driven deep into the silicon thereby forming a deep channel. If the implantation energy is reduced to keep the implant shallow, the individual ions' electrical fields repel one another thereby scattering and diffusing the implant which is undesirable.

Another approach has been to use cluster ion-beam implantation. At the Kyoto University in Japan, it was reported that a beam of $B_{10}H_{14}$ ions were implanted at 2 KeV with a dose of $10^{12}$ ions/cm$^2$. It was reported that by using cluster ion-beam implantation, a shallower channel resulted. It was reported that cluster ion-implantation created a functioning p-channel MOS transistor with a 40 nanometer gate, however, the device showed some threshold degradation as a result of the short-channel effect. A 50 nanometer transistor was reportedly built using the same technique and exhibited reportedly good gain and 0.4 mA/micron current.

In order to minimize or eliminate short-channel effects of devices created for ultra-large-scale-integration, it is desirable to provide a MOS transistor having the depth of the channel region shallower than 40 nanometer.

It is thus desirable to provide a transistor that provides acceptable immunity to short-channel effects that can be utilized in ultra-large-scale integration. It is also desirable to provide a method for fabricating such a transistor. Furthermore, it is desirable to provide a transistor that has a source/drain extension depth of less than 40 nanometers.

SUMMARY OF THE INVENTION

Advantages of the present invention will become apparent upon consideration of the following detailed description of the presently preferred embodiments of the invention together with the accompanying drawings.

According to one aspect of the invention, there is provided a MOS transistor comprising a source well located in a substrate, a drain well located in the substrate, a channel located in the substrate between the source and drain wells wherein the channel separates the source and drain wells, a source extension located in a portion of the channel adjacent to and coupled with the source well wherein the source extension has a thickness less than 40 nanometers, a drain extension located in a portion of the channel adjacent to and coupled with the drain well wherein the drain extension has a thickness less than 40 nanometers, and a gate disposed on the surface of the substrate located over the channel.

According to a second aspect of the invention, there is provided a method of making a MOS transistor, the method comprising the steps of forming a gate stack on a surface of a substrate, forming an oxide spacer on sides of the gate stack, depositing a layer of high-K dielectric material over the gate stack and the surface of the substrate, reducing the thickness of the layer of high-K dielectric material to less than the thickness of the gate stack to expose a portion of the gate electrode material such as polysilicon, removing the exposed portion of the high-K dielectric and oxide spacer, depositing polysilicon over the gate stack and the layer of high-K dielectric material, removing a portion of the polysilicon to form a T-shape gate and removing a portion of the high-K dielectric material outside of the gate.

BRIEF DESCRIPTION OF THE DRAWINGS

The drawings referred to in this description should be understood as not being drawn to scale except if specifically noted. Moreover, the drawings are intended to illustrate only one portion of an integrated circuit and its fabrication according to the present invention.

DETAILED DESCRIPTION OF THE PRESENTLY PREFERRED EMBODIMENTS

Figure 1:
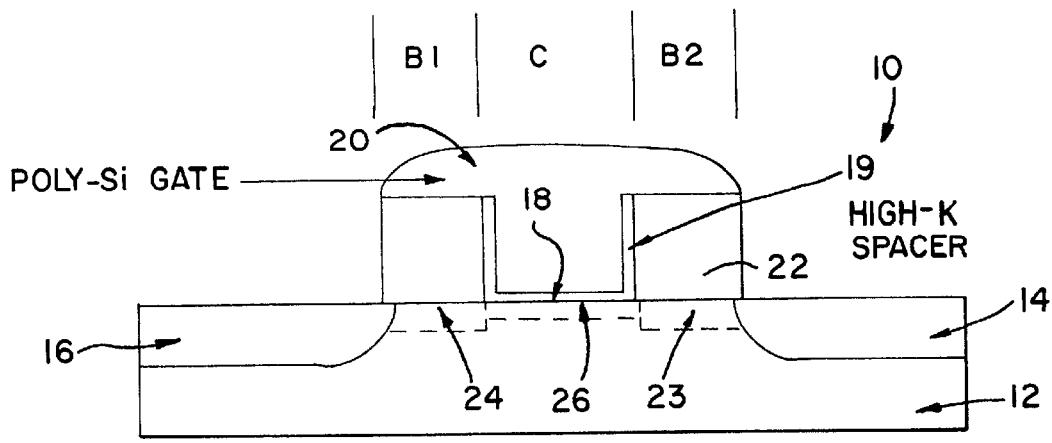
FIG. 1 is a cross-sectional view of a partially formed MOS transistor according to a preferred embodiment of the present invention.
Figure 2:
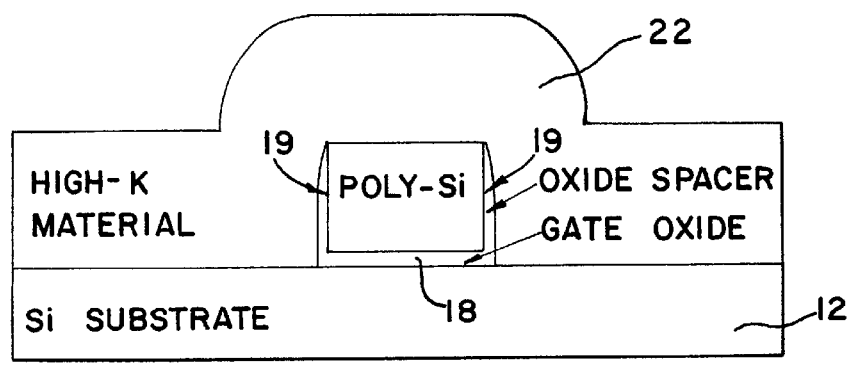
FIGS. 2–5 are cross-sectional views of a MOS transistor fabricated according to a preferred embodiment of the present invention at various stages of fabrication.
Figure 3:
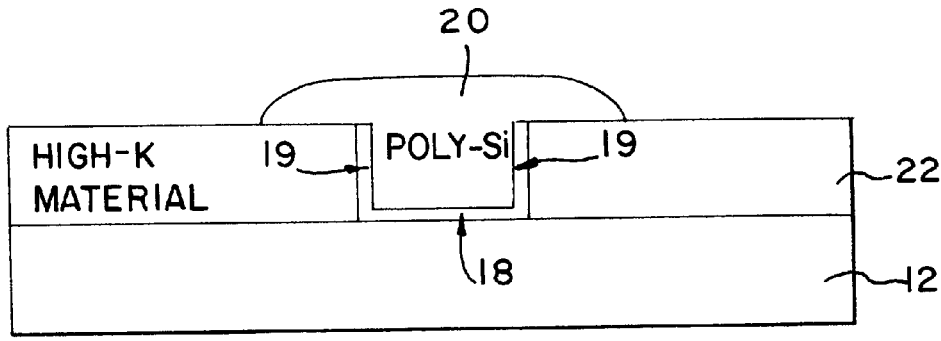

Reference is now made in detail to a specific embodiment of the present invention. Like reference numerals refer to like elements throughout.

FIG. 1 is a cross-sectional view of a partially formed MOS transistor according to a preferred embodiment of the present invention. Conventional items such as the gate, source and drain connections have not been shown in order to avoid obscuring the invention.

The transistor 10 includes a substrate 12, a first well 14 that will form a drain (hereinafter "the drain well 14"), a second well 16 that will form a source (hereinafter "the source well 16") a gate structure generally referred to by numeral 20. That gate structure 20 includes an oxide layer 18, an oxide spacer 19, a spacer layer 22, and a layer of polysilicon 21. A drain connection (not shown) will be coupled to the drain well 14, a source connection (not shown) will be coupled to the source well 16, and a gate connection (not shown) will be coupled to the gate structure 20 as is well known to those of ordinary skill in the art and thus need not be further described herein.

The MOS transistor 10 is an enhancement-type transistor which requires a channel to be created under the gate region 20 in order for current to flow from the drain well 14 to the source well 16. For example, for a p-type substrate with n-type drain and source wells, an n-type channel is created by applying a positive voltage to the gate structure 20. Such a positive voltage at the gate attracts electrons from the substrate and causes them to accumulate at the surface of the substrate beneath the oxide layer 18. To attract a sufficient number of electrons to form an n-channel, the voltage at the gate has to be equal to or greater than a threshold voltage $V_T$. The channel couples the source and drain wells. For a n-type substrate with p-type drain and source wells a negative voltage either equal to or greater than a threshold voltage is applied to the gate region 20 in order to create a p-type channel.

As discussed in the background section, as the size of MOS transistors decrease, the channel length between the gate and drain wells also decreases. Typically the drain and source wells are relatively deep having a thickness of larger than about 150 nanometers. Such deep source and drain wells, however, subject the transistor to short-channel effects which is undesirable. It is desirable to provide shallow extensions from the deeper drain and source wells in order to allow the formation of a shallow channel. The present invention allows very shallow drain and source extensions to be created which minimizes undesirable short-channel effects.

As previously described, formed on the surface of the subtrate between the source and drain wells is the gate structure 20. The gate structure 20 includes an oxide layer 18, a spacer layer 22 and a layer of polysilicon 20. In a preferred embodiment, the spacer layer 22 is formed of a high-K dielectric material such as $TiO_2$ or $Ta_2O_5$, for example. The oxide layer 18 preferably has a thickness ranging from about 2 to about 3 nanometers, the oxide spacer 19 has a thickness ranging from about 3 to about 5 nanometers, the spacer layer 22 has a thickness ranging from about 80 to about 150 nanometers and the polysilicon layer 20 has a maximum thickness ranging from about 100 to about 250 nanometers.

Because a high-K dielectric is used for the spacer layer 22 its equivalent electrical thickness is much smaller compared to the gate oxide 18. Parasitic transistors in spacer regions B1 and B2 thus have a much lower threshold voltage than transistor 10 and will be turned on before the transistor 10 is turned on. The parasitic transistors B1 and B2 are designed to operate at depletion mode, i.e., the drain and source extensions 23, 24 under the spacer layer 22 are deeply inverted even when the gate voltage is zero. When gate voltage is raised to the threshold voltage of the transistor 10, the silicon surface of transistor between extensions 23, 24 becomes inverted and the channel between source and drain is formed allowing current to flow from drain well 14 to the source well 16. Because the silicon surface under the spacer layer 23 is deeply inverted when no voltage is applied to the gate, those regions act as extensions of the drain and source wells 14, 16, respectively. The drain and source extensions 23, 24 have a much shallower depth as compared with conventional ion implanted extensions. The shallower extensions 23, 24 provide superior immunity to short-channel effect.

The operation of the MOS transistor 10 in FIG. 1 will now be described followed by a description of a method of fabricating such a transistor. In the transistor show in FIG. 1, a shallow drain extension 23 (shown in dotted line) is formed adjacent to and coupled to the deeper drain well 14 and a shallow source extension 24 (shown in dotted line) is formed adjacent to and coupled to the deeper source well 16.

The shallow drain and source extensions 23, 24 are created by the spacer layer 22. When a voltage that is equal to or greater than the threshold voltage is applied to the gate of the transistor 10, a shallow channel 26 (shown in dotted line) is created.

The very thin oxide spacer 19 on the side-wall of the polysilicon gate 21 prevents possible fringing electrical field effect on the sides of the gate.

The method of fabricating the transistor 10 shown in FIG. 1 will now be described with reference to FIGS. 2–5. First, a gate stack including an oxide layer 18 and polysilicon gate 20 is formed on the substrate in a conventional manner and thus need not be described in detail herein. Next a very thin oxide spacer 19 is formed on the sides of the polysilicon gate 20 by conventional spacer formation techniques. Then a layer of high-K dielectric 22 is deposited over the gate 20 and top surface of the substrate. Preferably the layer of high-K dielectric is deposited by sputtering at a temperature lower than 500° C. Other deposition methods may be used such as chemical vapor deposition. The high-K dielectric layer 22 is formed preferably to a thickness of about 80 to about 150 nanometers resulting in the structure shown in FIG. 2.

Next the thickness of the dielectric layer 22 is reduced by chemically-mechanically polishing it to the same thickness as the gate stack. A wet etch is then performed to further reduce the dielectric layer below the gate stack so that the gate electrode is exposed and the oxide spacer that extends above the dielectric layer is removed by conventional methods resulting in the structure shown in FIG. 3.

Figure 4:
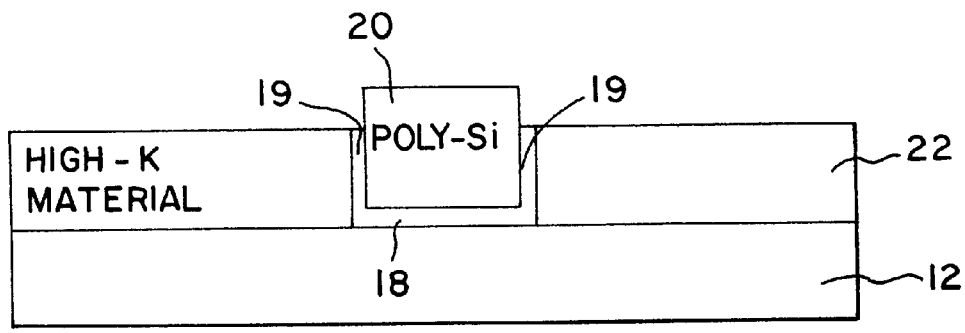
Figure 5:
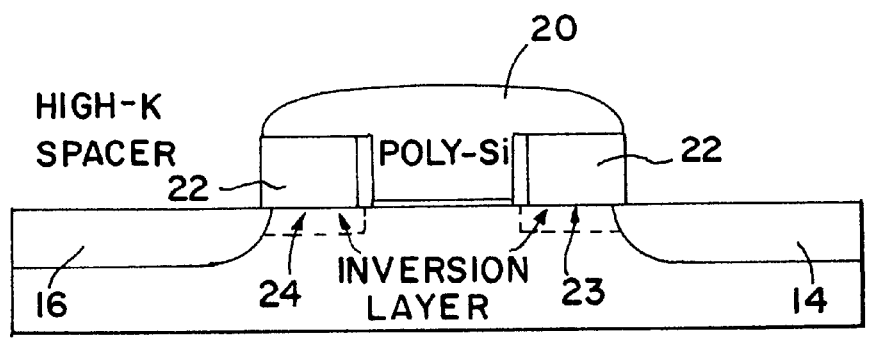

More polysilicon is then deposited preferably by employing low pressure chemical vapor deposition (LPCVD) at 650° C. Portions of the deposited polysilicon are etched away by well known spacer formation techniques to form a T-shaped polysilicon gate as shown in FIG. 4.

Next the layer of dielectric material 22 outside of the gate region is etched away anisotropically by a dry etch. Then the drain and source wells 23, 24 are formed by ion implantation as is well known to those of ordinary skill in the art resulting in the structure shown in FIG. 5. Metal contacts are made to the gate 20, drain and source wells by well known techniques.

The foregoing description of the preferred embodiments of the present invention has been presented for purposes of illustration and description. It is not intended to be exhaustive or to limit the invention to the precise form disclosed. Many modifications and variations will be apparent to practitioners skilled in the art. It is possible that the invention may be practiced in other fabrication technologies in MOS processes.

Similarly, any process steps described might be interchangeable with other steps in order to achieve the same result. The embodiments were chosen and described in order to best explain the principles of the invention and its practical application, thereby enabling others skilled in the art to understand the invention for various embodiments and with various modifications as are suited to be particular use contemplated. It is intended that the scope of the invention be defined by the claims appended hereto and their equivalents.

What is claimed is:

1. A MOS transistor comprising:
   a source well and a drain well formed in a semiconductor substrate and defining a channel therebetween;
   a gate stack including a gate oxide formed on a surface of the semiconductor substrate over a portion of the channel and a gate on the gate stack; and a first spacer positioned on the surface of the semiconductor substrate on a source side of the gate stack over a source extension region in the channel between the source well and the gate stack in the semiconductor substrate and a second spacer positioned on the surface of the semiconductor substrate on a drain side of the gate stack over a drain extension region in the channel between the drain well and the gate stack in the semiconductor substrate, the first spacer and the second spacer being formed of a relatively high-K dielectric material to invert the surface of the semiconductor substrate in the source extension region and the drain extension region even when no voltage is applied to the gate stack of the MOS transistor, wherein said gate is on said high-K dielectric material on said source side and said drain side.

2. The MOS transistor of claim 1 wherein the gate stack comprises a gate oxide and wherein the high-K dielectric material has an electrical thickness much smaller than an electrical thickness of the gate oxide.

3. The MOS transistor of claim 1 wherein the high K dielectric material comprises one of $TiO_2$ and $Ta_2O_5$.

4. The MOS transistor of claim 1, wherein the inverted surface of the semiconductor substrate forms the source extension region and the drain extension region in the channel adjacent the source well and the drain well, respectively.

5. The MOS transistor of claim 1, wherein said gate comprises silicon and overlaps a portion of the first spacer over the source extension region and the second spacer over the drain extension region to electrically invert the surface of the semiconductor substrate at the source extension region and the drain extension region when a normal operating voltage is applied to the gate.

6. A MOS transistor comprising:

a source well located in a substrate;

a drain well located in the substrate;

a channel located in the substrate between the source well and the drain well wherein the channel separates the source and drain wells;

a source extension region located in a portion of the channel adjacent to the source well;

a drain extension region located in a portion of the channel adjacent to the drain well;

a gate including a gate oxide layer disposed on a surface of the substrate and a polysilicon layer electrically isolated from channel by the gate oxide layer, the gate being located over a portion of the channel between the source extension region and the drain extension region; and a spacer layer disposed on the surface of the substrate on a source side and a drain side of the gate, the spacer layer being formed of a high-K material to have an equivalent electrical thickness less than an electrical thickness of the gate oxide layer so that the surface of the substrate in the source extension region and the drain extension region is inverted when no voltage is applied to the gate, wherein said polysilicon layer is on said high-K material on said source side and said drain side.

7. A MOS transistor according to claim 1 wherein the gate includes a layer of polysilicon disposed on a thin layer of oxide on the surface of the substrate over the channel, the thin layer of oxide forming the gate oxide layer.

8. A MOS transistor according to claim 7 further comprising an oxide spacer located between the spacer layer and the layer of polysilicon.

9. A MOs transistor according to claim 7 wherein the spacer layer has a thickness ranging from about 80 nanometers to about 150 nanometers.

10. A MOS transistor according to claim 1 wherein said spacer layer is a high-K dielectric.

11. A MOS transistor according to claim 1 wherein the drain and source extensions have a thickness less than 30 nanometers.

12. A MOS transistor according to claim 1 wherein the drain and source extensions have a thickness less than 20 nanometers.

13. A MOS transistor according to claim 1 wherein the source and drain extensions are depletion regions in the substrate.

* * * * *

UNITED STATES PATENT AND TRADEMARK OFFICE
CERTIFICATE OF CORRECTION

PATENT NO. : 6,271,563 B1  
DATED : August 7, 2001  
INVENTOR(S) : Bin Yu et al.

It is certified that error appears in the above-identified patent and that said Letters Patent is hereby corrected as shown below:

Column 2,
Line 57, "by" should read -- be --.

Column 6,
Line 28, "MOs" should read -- MOS --.

Signed and Sealed this

Twenty-second Day of January, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,271,563 B1                                       Page 1 of 1
DATED         : August 7, 2001
INVENTOR(S)   : Bin Yu et al.

It is certified that error appears in the above-identified patent and that said Letters Patent is hereby corrected as shown below:

<u>Column 2,</u>
Line 57, "by" should read -- be --.

<u>Column 6,</u>
Line 28, "MOs" should read -- MOS --.

Signed and Sealed this

Fourth Day of February, 2003

JAMES E. ROGAN
*Director of the United States Patent and Trademark Office*